United States Patent
Rabinovitch et al.

(10) Patent No.: US 10,423,740 B2
(45) Date of Patent: Sep. 24, 2019

(54) LOGIC SIMULATION AND/OR EMULATION WHICH FOLLOWS HARDWARE SEMANTICS

(75) Inventors: Alexander Rabinovitch, Shrewsbury, MA (US); Ramesh Narayanaswamy, Palo Alto, CA (US)

(73) Assignee: SYNOPSYS, INC., Mountain View, CA (US)

( * ) Notice: Subject to any disclaimer, the term of this patent is extended or adjusted under 35 U.S.C. 154(b) by 1689 days.

(21) Appl. No.: 12/432,017

(22) Filed: Apr. 29, 2009

(65) Prior Publication Data
US 2010/0280814 A1 Nov. 4, 2010

(51) Int. Cl.
G06F 17/50 (2006.01)

(52) U.S. Cl.
CPC .................. G06F 17/5022 (2013.01)

(58) Field of Classification Search
CPC ............ G06F 17/5022; G06F 17/5031; G06F 17/5054
USPC .......................................................... 703/16
See application file for complete search history.

(56) References Cited

U.S. PATENT DOCUMENTS

| | | | | |
|---|---|---|---|---|
| 5,490,266 A * | 2/1996 | Sturges | ............... | G06F 17/5022 703/13 |
| 6,058,492 A | 5/2000 | Sample | | |
| 6,606,734 B2 * | 8/2003 | Greaves | .............. | G06F 17/5022 716/103 |
| 6,785,873 B1 * | 8/2004 | Tseng | ............................ | 716/102 |
| 7,047,175 B1 * | 5/2006 | Jain | ...................... | G06F 17/5031 703/19 |
| 7,131,091 B1 * | 10/2006 | Ganesan | ............. | G06F 17/5022 716/108 |
| 7,191,412 B1 | 3/2007 | Lin | | |
| 7,370,312 B1 | 5/2008 | Steckel | | |
| 2003/0105620 A1 * | 6/2003 | Bowen | ................ | G06F 17/5022 703/22 |
| 2003/0131325 A1 * | 7/2003 | Schubert et al. | ................. | 716/4 |

(Continued)

OTHER PUBLICATIONS

Phil Moorby, "Achieving Determinism in System Verilog 3.1 Scheduling Semantics", DVCon 2003.*

(Continued)

*Primary Examiner* — Omar F Fernandez Rivas
*Assistant Examiner* — Robert S Brock
(74) *Attorney, Agent, or Firm* — Park, Vaughan, Fleming & Dowler LLP; Laxman Sahasrabuddhe

(57) ABSTRACT

Some embodiments of the present invention provide techniques and systems for simulating a circuit design so that the simulation follows hardware semantics. Specifically, some embodiments ensure that the simulation follows hardware semantics by properly handling race conditions in state elements and/or glitches in clock trees that can occur during logic simulation. Each logic simulation cycle can include two stages: a stimuli application stage in which the system evaluates signal values of the circuit design which do not depend on a clock signal, and a clock propagation stage in which the system evaluates signal values that depend on a clock signal. Some embodiments of the present invention sample signal values during the stimuli application stage, and use the sampled signal values during the clock propagation stage to handle race conditions in state elements and/or glitches in clock trees that may occur during logic simulation.

22 Claims, 11 Drawing Sheets

(56) References Cited

U.S. PATENT DOCUMENTS

| | | | |
|---|---|---|---|
| 2003/0188299 A1 | 10/2003 | Broughton | |
| 2006/0090149 A1* | 4/2006 | Blanco | G06F 17/5031 716/102 |
| 2006/0117274 A1* | 6/2006 | Tseng et al. | 716/1 |
| 2006/0123300 A1* | 6/2006 | Gupta | G06F 17/505 714/741 |
| 2008/0071515 A1* | 3/2008 | Bhadra | G06F 17/5031 703/16 |
| 2009/0217075 A1* | 8/2009 | Adar | G01R 31/31726 713/500 |

OTHER PUBLICATIONS

IEEE Computer Society, "IEEE Standard for Verilog®, Hardware Description Language", IEEE Std 1364 2005, Apr. 7, 2006.*

Clifford E. Cummings Arturo Salz, SystemVerilog Event Regions, Race Avoidance & Guidelines, In Synopsys User Group Conference Proc. (SNUG 2006), Boston, 2006, 42 pages, obtained from http://www.sunburst-design.com/papers/CummingsSNUG2006Boston_SystemVerilog_Events.pdf on May 15, 2016.*

Short, Kenneth L., VHDL for engineers, Pearson-Prentice Hall, Apr. 19, 2008, 721 pages.*

Authors Unknown, LOOKupbyISBN—entry for VHDL for Engineers, web page obtained from http://www.lookupbyisbn.com/Lookup/Book/0131424785/9780131424784/1 on May 27, 2016, 2 pages.*

Authors Unknown, Valore Books—entry for VHDL for Engineers, web page obtained from https://www.valorebooks.com/textbooks/vhdl-for-engineers-1st-edition/9780131424784 on May 27, 2016, 4 pages.*

Palnitkar, Samir, and Darrell Parham. "Cycle simulation techniques." In Verilog HDL Conference, 1995. Proceedings., 1995 IEEE International, pp. 2-8. IEEE, 1995 (Year: 1995).*

Mallet, Frédéric, Charles André, and Robert De Simone. "Logical time: specification vs. implementation." ACM SIGSOFT Software Engineering Notes 36, No. 1 (2011): 1-8. (Year: 2011).*

* cited by examiner

LOGIC SIMULATION AND/OR EMULATION WHICH FOLLOWS HARDWARE SEMANTICS

BACKGROUND

Field

This disclosure is generally related to electronic design automation. More specifically, this disclosure is related to methods and apparatuses for logic simulation and/or emulation.

Related Art

Rapid advances in computing technologies have been made possible by advances in design and verification tools because without such tools it would be almost impossible to design and verify complicated integrated circuits which are commonly found in today's computing devices. Logic simulation and emulation technologies play an important role in verifying a circuit design.

Note that it is generally desirable to improve accuracy of logic simulation and/or emulation technologies. For example, semiconductor companies often use hardware emulation to verify the behavior of a circuit design by emulating the circuit design over millions of cycles. If a bug is detected during hardware emulation, the bug is typically localized to a reasonably small range of cycles, e.g., thousands of cycles. Then, a detailed logic simulation is performed over the small range of cycles to debug the circuit.

To successfully debug the circuit using this approach, the simulator should ideally simulate the circuit in a manner that follows hardware semantics. If the logic simulator simulates the circuit in a manner that does not follow hardware semantics, the logic simulator may not be able to replicate the bug, or the bug may manifest itself differently during the simulation. In either case, the bug will not be fixed. Unfortunately, conventional logic simulators do not simulate the circuit in a manner that follows hardware semantics.

SUMMARY

Some embodiments of the present invention provide techniques and systems for simulating a circuit design so that the simulation follows hardware semantics. Specifically, some embodiments ensure that the simulation follows hardware semantics by properly handling race conditions in state elements and/or glitches in clock trees that can occur during logic simulation.

Note that a circuit can be simulated at different levels of abstraction. Further, a circuit can be simulated using different techniques. The techniques and systems described in this disclosure are generally applicable to any type of logic simulation which needs to properly handle race conditions in state elements and/or glitches in clock trees that can occur during logic simulation. Specifically, the techniques and systems described in this disclosure can be used in logic simulators and emulators.

A logic simulation cycle can be considered to include two stages: a stimuli application stage and a clock propagation stage. In the stimuli application stage, stimuli are applied and values are propagated through combinational logic. At the end of the stimuli application stage, the combinational logic reflects the effect of the stimuli that were applied. Note that the values that propagated in this stage do not depend on a clock signal. In the clock propagation stage, the system evaluates signal values that depend on a clock signal. Some embodiments of the present invention sample signal values during the stimuli application stage, and use the sampled signal values during the clock propagation stage to handle race conditions in state elements and/or glitches in clock trees that may occur during logic simulation. Specifically, to ensure that the logic simulation follows hardware semantics, some embodiments simulate level-sensitive sequential circuit elements (e.g., latches) and edge-triggered sequential circuit elements (e.g., flip-flops) in a manner that is different from conventional logic simulators.

Note that a circuit can include one or more level-sensitive sequential circuit elements and/or one or more edge-triggered sequential circuit elements. Some embodiments of the present invention ensure that the following requirements are satisfied: (1) when two or more edge-triggered sequential circuit elements are evaluated within the same clock cycle, the new output value of one of the edge-triggered sequential circuit elements should not affect the output value of another edge-triggered sequential circuit element in that cycle; (2) the output of a level-sensitive sequential element should not change during the clock propagation stage if the latch's clock becomes stable inactive by the end of the cycle; and (3) the above two requirements need to be satisfied even when one of the clocks is the result of updating a sequential circuit element.

A level-sensitive sequential circuit element propagates its input value(s) to its output(s) when at least one condition in a group of conditions is true. The system may simulate a level-sensitive sequential circuit element as follows. During the stimuli application stage, the system can sample a level-sensitive sequential circuit element's output to obtain a sampled value. Next, during the clock propagation stage, if the system determines that all conditions in the group of conditions are false, the system can assign the sampled value to the sequential element's output.

An edge-triggered sequential circuit element propagates its data input value(s) to its data output(s) upon receiving a triggering edge-transition on at least one of its clock input(s). Without loss of generality, we can assume that a triggering edge-transition occurs when the clock input transitions from a first value to a second value. For a positive edge triggered sequential element, the first value is a low value and the second value is a high value, whereas for a negative edge triggered sequential element, the first value is a high value and the second value is a low value. The system may simulate an edge-triggered sequential circuit element as follows. During the stimuli application stage, the system can sample an edge-triggered sequential circuit element's input, output, and clock, to obtain a sampled input value, a sampled output value, and a sampled clock value. Next, during the clock propagation stage, if the system detects that the clock input experienced a triggering edge-transition from the first value to the second value, and that the sampled clock value is equal to the first value, the system can assign the sampled input value to the sequential circuit element's data output. Further, during the clock propagation stage, if the system detects a non-triggering edge transition in the clock input from the second value to the first value, the system can assign the sampled output value to the sequential circuit element's data output.

Note that the sequential element's output may have changed after the system sampled their values during the stimuli application stage. Hence, when the system assigns a sampled value to the sequential element's output, the system effectively assigns a value to the sequential element's output that is different from the value that would have been assigned by a conventional simulator and/or emulator. This conditional modification of the sequential element's output prevents inaccuracies in the logic simulation and/or emulation due to race conditions in state elements and/or glitches in the clock signal. In particular, embodiments of the present invention can generally be used with any simulator, which include, but are not limited to, event driven simulators, cycle based simulators, and simulators that use oblivious simulation techniques.

Note that, during the clock propagation stage, it may not be possible to determine whether the current evaluation is the last evaluation. However, if the system ensures that the simulation state is consistent with hardware semantics at the end of each evaluation, it can guarantee that the simulation state will be consistent with hardware after the last evaluation. Some embodiments of the present invention ensure that the simulation state is consistent with hardware semantics at the end of each evaluation, thereby ensuring that the simulation state is consistent with hardware semantics at the end of the clock propagation stage.

A hardware description language may or may not support a sampling instruction. If the hardware description language does not support a sampling instruction, the system can modify the semantics of the hardware description language so that the simulator simulates or emulates a sequential circuit element in a manner that follows the hardware semantics. On the other hand, if the hardware description language supports a sampling instruction, the system can optionally re-write a sequential circuit element's description using the sampling instruction so that the rewritten circuit description follows hardware semantics. Note that embodiments of the present invention can be applied to two value logic as well as multi-valued logic. Specifically, embodiments of the present invention can be used for simulating four-valued logic.

Tables 1A and 1B illustrate how a latch, which is a level-sensitive sequential circuit element, can be simulated using new semantics in accordance with an embodiment of the present invention.

Table 2 shown below illustrates how a flip-flop, which is an edge-triggered sequential element, can be simulated using the new semantics in accordance with an embodiment of the present invention.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit (IC) Design Flow

Figure 1:
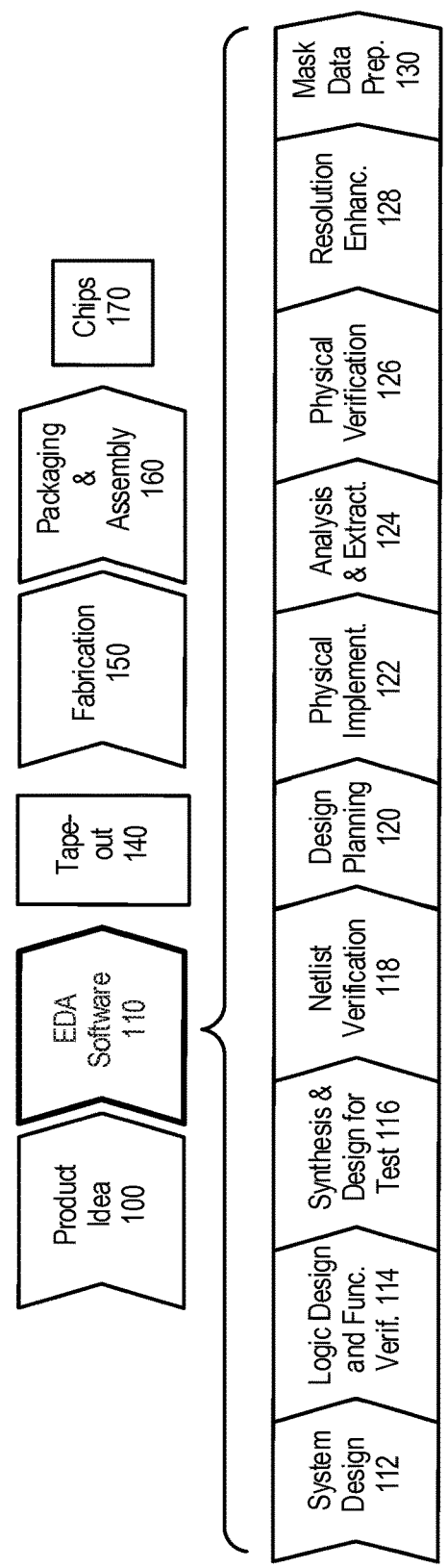
FIG. 1 illustrates various stages in the design and fabrication process of an integrated circuit in accordance with an embodiment of the present invention.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL, Verilog, or SystemVerilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Logic Simulation System

Figure 2:
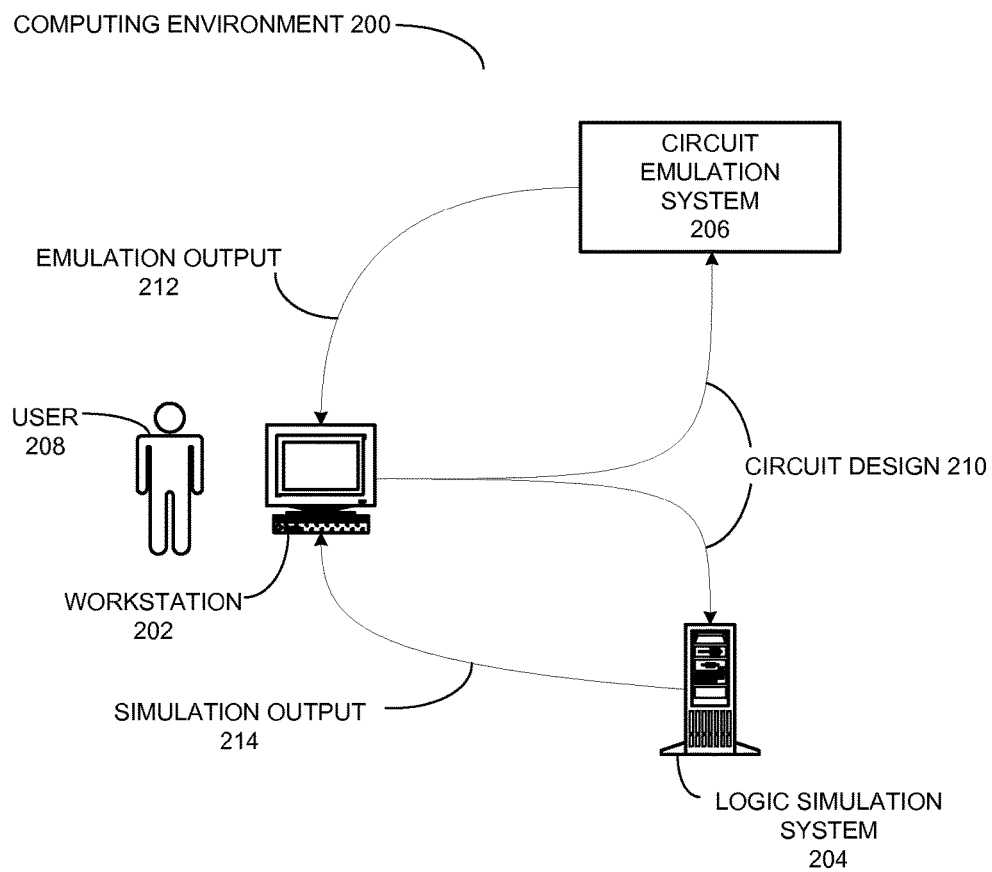
FIG. 2 illustrates an exemplary computing environment for analyzing a circuit design in accordance with an embodiment of the present invention.

FIG. 2 illustrates an exemplary computing environment for analyzing a circuit design in accordance with an embodiment of the present invention. Computing environment 200 can include a workstation 202, a logic simulation system 204, and a circuit emulation system 206. During operation, a user 208 can create an implementation for a circuit design using workstation 202. User 208 may use logic simulation system 204 to simulate a portion of circuit design 210, and generate a simulation output 214. User 208 may also use circuit emulation system 206 to emulate circuit design 210, and generate emulation output 212. Note that circuit emulation system 206 can use specialized hardware to speed up circuit emulation. If emulation output 212 indicates that circuit design 210 has a bug, user 208 can use logic simulation system 204 to help debug circuit design 210.

Figure 3:
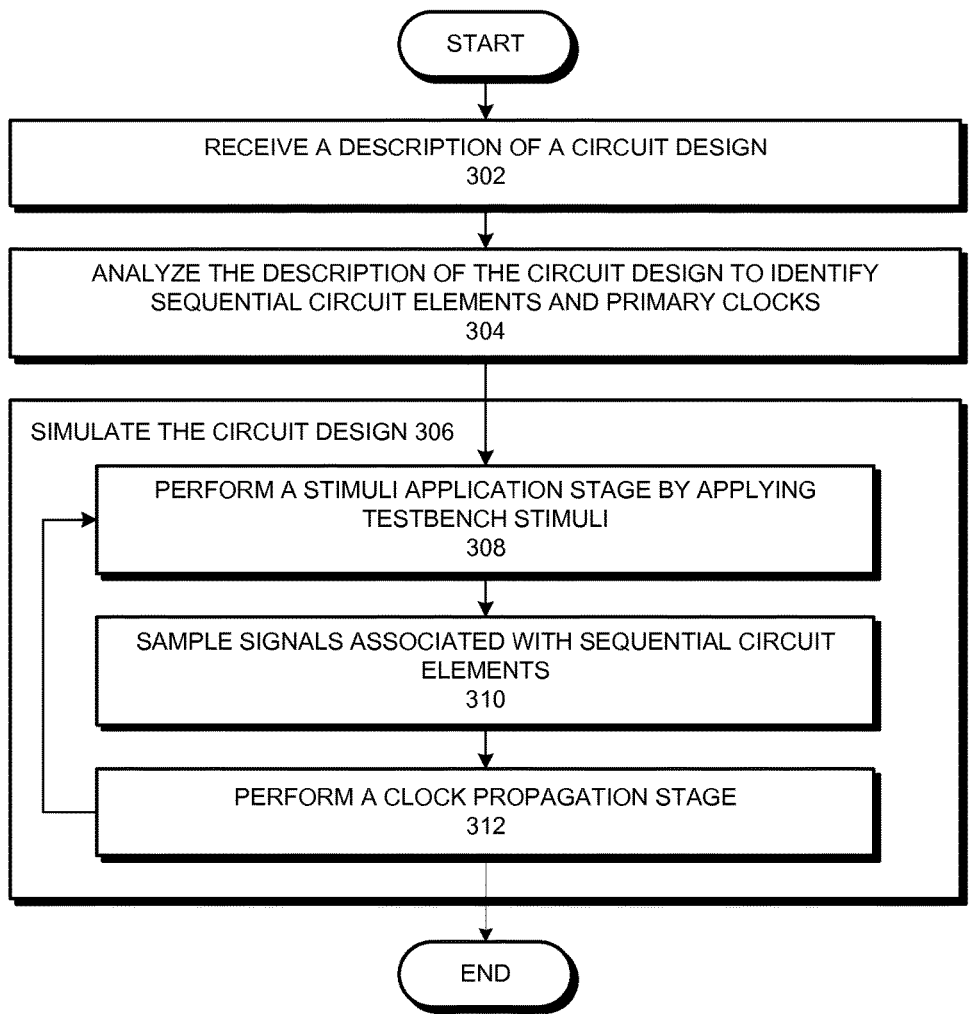
FIG. 3 presents a flow chart illustrating a process for generating a simulation output for a circuit design in accordance with an embodiment of the present invention.

FIG. 3 presents a flow chart illustrating a process for simulating a circuit design in accordance with an embodiment of the present invention.

The process can be performed by a computer system, which includes a computer-readable storage medium storing instructions that when executed by the computer system cause the computer system to simulate a circuit design. The system can begin by receiving a description of a circuit design (operation 302). The circuit can be described using any hardware description language, which includes, but is not limited to, VHDL, Verilog, SystemVerilog, or any other hardware description language now known or later developed. Then, the system can analyze the description of the circuit design to identify sequential circuit elements and primary clocks (operation 304) which need to be simulated according to the new semantics. Next, the system can simulate the circuit design (operation 306) according to the new semantics. In some embodiments, a compiler can be modified so that the executable generated by the compiler includes instructions which implement the new semantics. In other embodiments, the system can re-write the circuit description using a "sample" instruction so that the re-written description implements the new semantics.

In each simulation cycle, the system can perform a stimuli application stage by applying testbench stimuli (operation 308), in which the system evaluates signals that do not depend on a clock input of the circuit design. During the stimuli application stage, or after the stimuli application stage is completed and before the clock propagation stage begins, the system can sample signals associated with the sequential circuit elements (operation 310). Next, the system can perform a clock propagation stage (operation 312), in which the system can evaluate signals that depend on a clock input of the circuit design.

Level-Sensitive Sequential Element

A level-sensitive sequential element is generally any sequential element that propagates a data input value to a data output when one or more conditions are met. For example, a latch propagates its data input's value to its output if the latch's clock input (i.e., the enable signal) is stable active. Note that, in general, a level-sensitive sequential element can have multiple inputs and outputs. Further, the one or more conditions under which the level-sensitive sequential element's input value(s) are propagated to its output(s) can be arbitrarily complex.

Tables 1A and 1B illustrate how a latch, which is a level-sensitive sequential circuit element, can be simulated using new semantics in accordance with an embodiment of the present invention.

A latch can be described using the following hardware description language statement: "always @(C or D) if (C) Q=D," where "C" is the latch's clock input, "D" is the latch's input, and "Q" is the latch's output. Some embodiments of the present invention simulate a latch according to new semantics which are different from the conventional semantics that are used by conventional simulators.

Specifically, as shown in Table 1A below, a latch is simulated as follows. If the clock input of the latch (C) changes in value, or if the data input of the latch (D) changes in value, then the data output of the latch (Q) is assigned the value from the data input (D) if the clock input (C) holds a stable active value. Otherwise, the sampled value is assigned to the data output of the latch.

TABLE 1A always @(C or D)
   if (C) Q = D else Q = sample(Q);

Note that Table 1A illustrated only one of many ways of representing the new semantics. For example, Table 1B shown below represents the new semantics in a different way. The first statement in Table 1B replicates the behavior of the conventional semantics: if the clock input of the latch (C) changes in value, or if the data input of the latch (D) changes in value, then the data output of the latch (Q) is assigned the value from the data input (D) if the clock input holds a triggering value (i.e., a stable active value). The second statement is new, i.e., conventional simulators will not perform the operations described in the second statement while simulating a latch. The second statement specifies that if the clock input transitions from a triggering value to a non-triggering edge value, then the data output of the latch is assigned the sampled value from the data output.

TABLE 1B always @(C or D)
   if (C) Q = D;
always @(negedge C)
   Q = sample(Q);

Note that the new simulation semantics shown in Tables 1A and 1B are applicable to two value logic as well as multi-valued logic. Specifically, the new simulation semantics can be used in a four-valued logic simulation.

Figure 4:
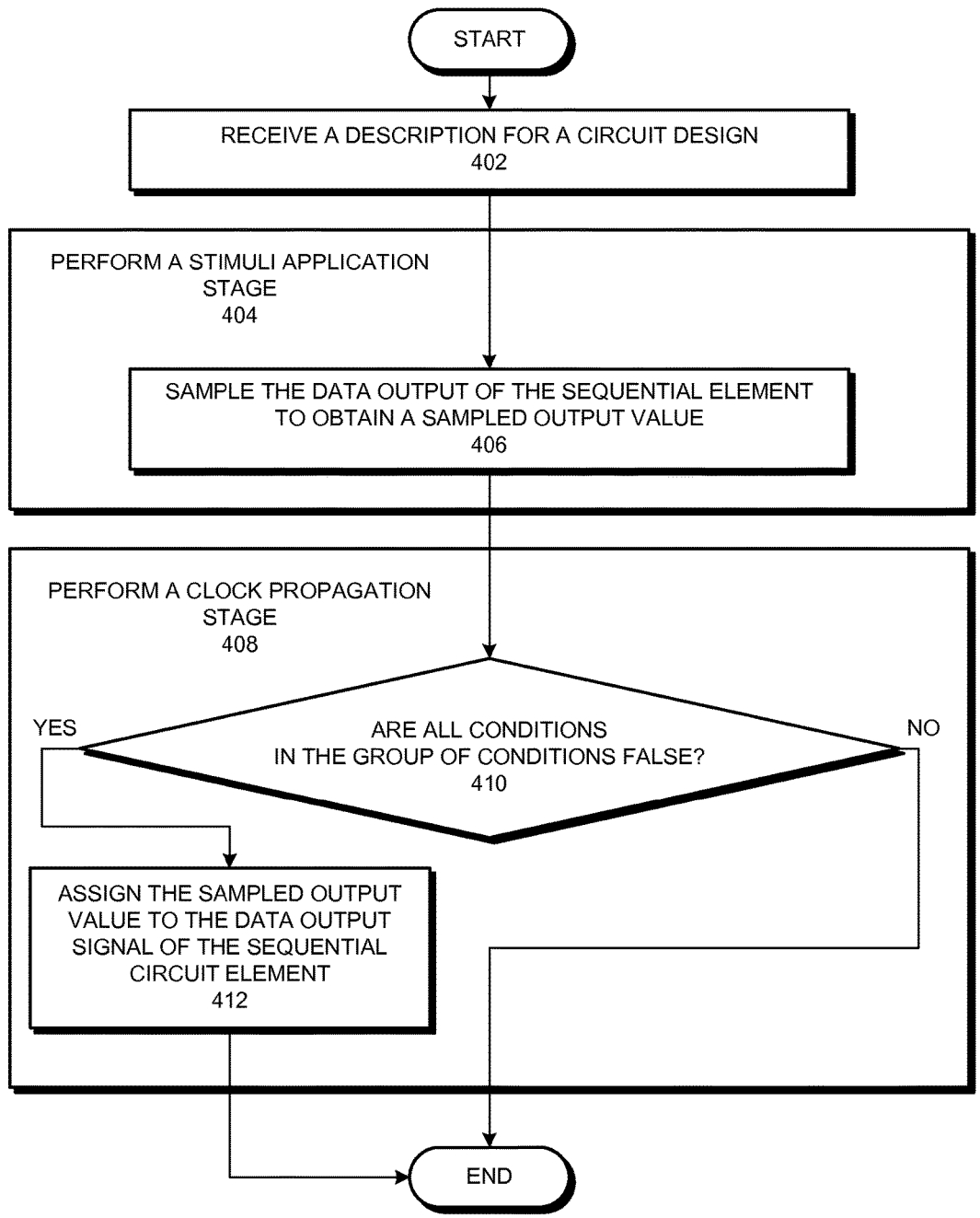
FIG. 4 presents a flow chart illustrating a process for simulating a level-sensitive sequential circuit element in accordance with an embodiment of the present invention.

FIG. 4 presents a flow chart illustrating a process for simulating a level-sensitive sequential circuit element in accordance with an embodiment of the present invention. Note that FIG. 4 illustrates the new operations that are performed under the new semantics. The operations that are performed under the conventional semantics (e.g., the first statement in Table 1A) are also performed, but have not been shown in FIG. 4 for the sake of clarity.

The system can begin by receiving a description of a circuit design (operation 402). Next, the system performs a stimuli application stage (operation 404) for the logic simulation of a level-sensitive sequential circuit element in the circuit design. Note that the level-sensitive sequential circuit element propagates its input value(s) to its output(s) when at least one condition in a group of conditions is true. In the stimuli application stage, the system samples the data output of the sequential element to obtain a sampled output value (operation 406). Then, the system performs a clock propagation stage (operation 408) for the logic simulation of the sequential circuit element. In the clock propagation stage, the system determines whether all conditions in the group of conditions are false (operation 410). If all conditions in the group of conditions are false, the system assigns the sampled output value to the data output signal of the sequential circuit element (operation 412). If at least one condition in the group of conditions is true, the system can simulate according to conventional semantics.

In some embodiments, operation 406 samples a signal's value towards the end of the stimuli application stage, and the system preserves the sampled value at least throughout the subsequent clock propagation stage. Therefore, if the clock propagation stage causes the signal's value to change, the sampled value for the signal will remain unaffected by the change.

Later sections in this disclosure describe how the new semantics help ensure that the simulation of a level-sensitive sequential circuit element will follow hardware semantics even if race conditions occur in state elements and/or glitches occur in the clock tree.

Edge-Triggered Sequential Element

An edge-triggered sequential element can generally have one or more inputs, outputs, and clocks. The edge-triggered sequential element propagates its input value(s) to its output(s) based at least on a triggering transition of at least one of its clock inputs.

Table 2 shown below illustrates how a flip-flop, which is an edge-triggered sequential element, can be simulated using the new semantics in accordance with an embodiment of the present invention.

A flip-flop is an edge-triggered sequential element which can be described by the following hardware description language code: "always @(posedge C) Q=D," where "D" is the flip-flop's data input, "Q" is the flip-flop's output, and "C" is the flip-flop's clock input. The first statement in the new semantics shown in Table 2 for the flop-flop specifies that if the clock input of the flip-flop (e.g., signal C) performs a triggering transition, and if the sampled clock value is equal to zero, then the data output of the flip-flop is assigned the sampled value from the data input of the flip-flop. The second statement specifies that if the clock input performs a non-triggering transition, then the data output of the flip-flop is assigned the sampled value from the data output. Note that the flip-flop example shown in Table 2 assumes, without loss of generality, that a triggering transition is from a zero value to a one value. The new simulation semantics shown in Table 2 are applicable to two value logic as well as multi-valued logic. Specifically, the new simulation semantics can be used in a four-valued logic simulation.

Figure 5A:
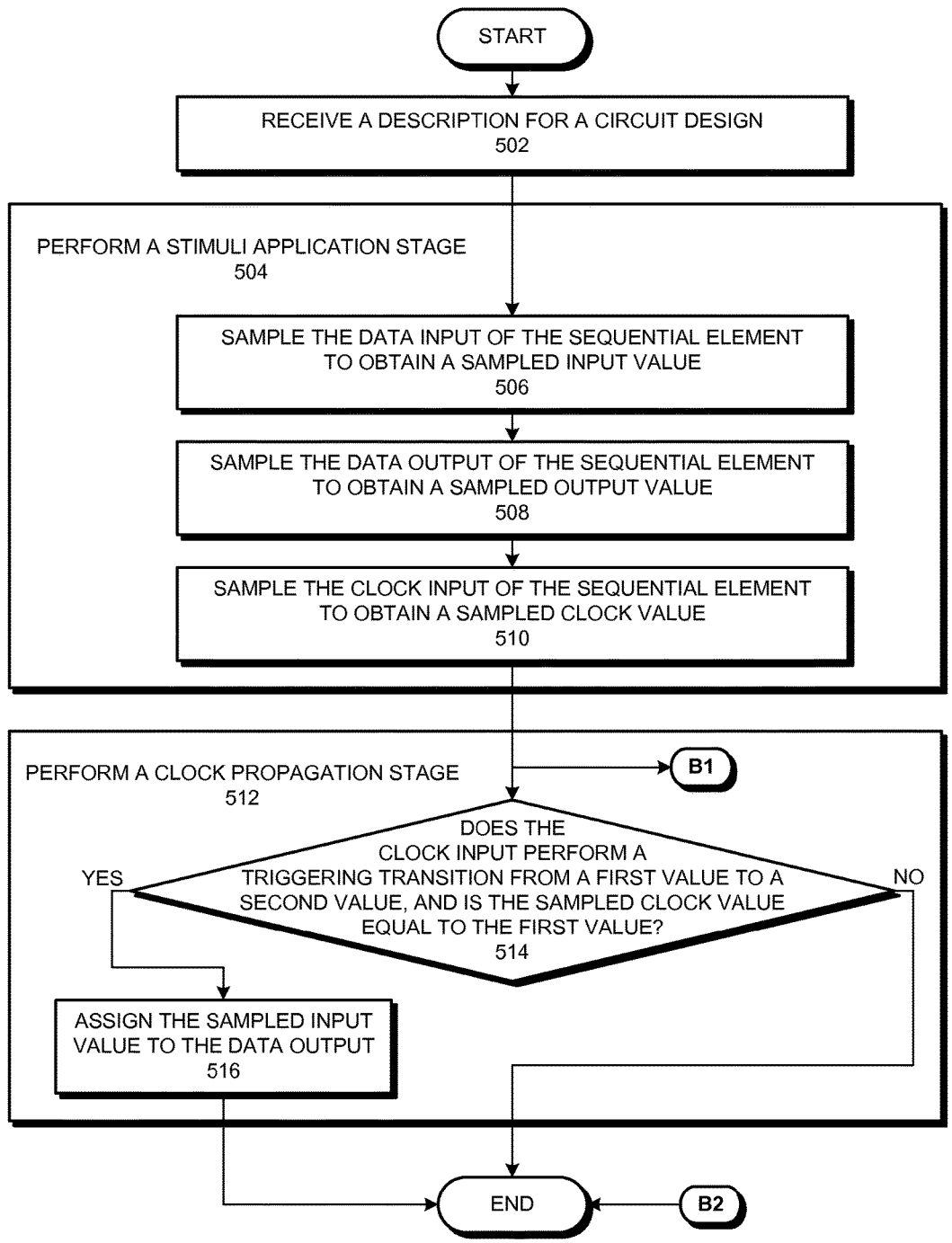
FIGS. 5A and 5B present a flow chart illustrating a process for simulating an edge-triggered sequential circuit element in accordance with an embodiment of the present invention.
Figure 5B:
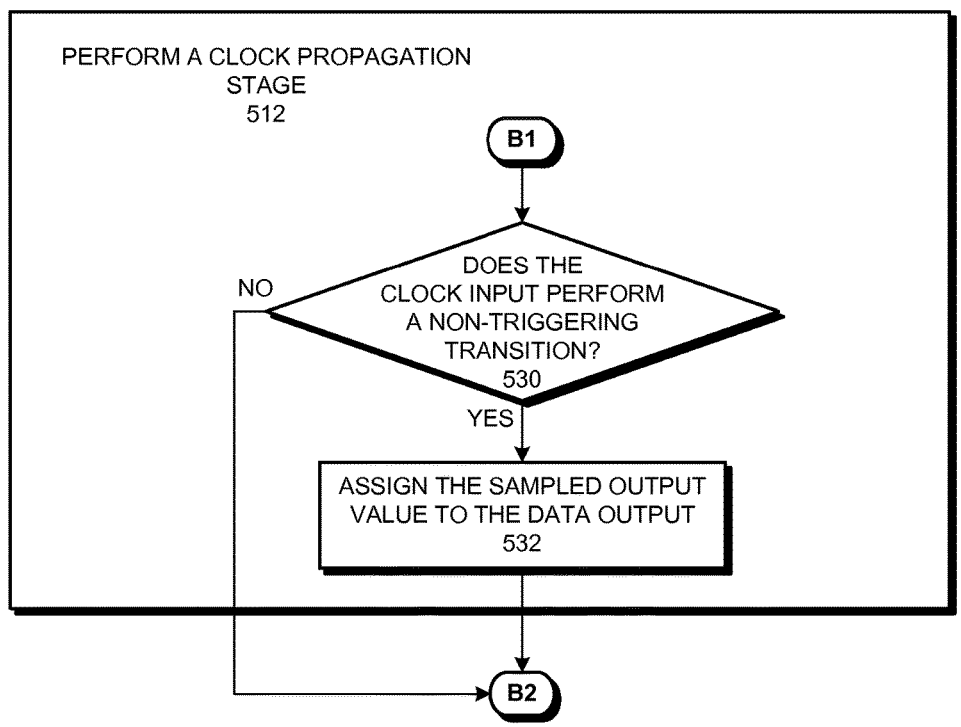

TABLE 2 always @(posedge C)
   if (sample(C)==0) Q = sample(D);
always @(negedge C)
   Q = sample(Q);

FIGS. 5A and 5B present a flow chart illustrating a process for simulating an edge-triggered sequential circuit element in accordance with an embodiment of the present invention. Note that FIGS. 5A and 5B illustrate the new operations that are performed under the new semantics. The labels "B1" and "B2" in FIGS. 5A and 5B have been used to split the flow chart into two sheets.

The system can begin by receiving a description of a circuit design (operation 502). Next, the system performs a stimuli application stage (operation 504) for the logic simulation of an edge-triggered sequential circuit element in the circuit design. During the stimuli application stage, the system samples the data input of the sequential circuit element to obtain a sampled input value (operation 506), samples the data output of the sequential circuit element to obtain a sampled output value (operation 508), and samples the clock input of the sequential circuit element to obtain a sampled clock value (operation 510). Note that the sampling order shown in FIG. 5A is for illustration purposes only. In general, the system can sample the signals in any order. Furthermore, the signals can be sampled towards the end of the stimuli application stage, because the sampled values need to be equal to the values that the signals have at the end of the stimuli application stage.

The system can then perform a clock propagation stage (operation 512) for the logic simulation of the sequential circuit element. During the clock propagation stage, the system determines whether the clock input for the sequential circuit element performs a triggering transition from a first value (e.g., zero) to a second value (e.g., one), and whether the sampled clock value is equal to the first value (operation 514). If both of these conditions are met, the system assigns the sampled input value to the data output signal of the sequential circuit element (operation 516).

Additionally, as shown in FIG. 5B, the system determines whether the clock input performs a non-triggering transition (operation 530) during the clock propagation stage. If so, the system assigns the sampled output value to the data output signal of the sequential circuit element (operation 532).

As mentioned above, signal values are sampled towards the end of the stimuli application stage, and the system preserves the sampled values at least throughout the subsequent clock propagation stage. Therefore, if a signal's value is erroneously changed during the clock propagation stage, the sampled value for the signal can be used to correct the error. Later sections in this disclosure describe how the new semantics help to ensure that the simulation of a flip-flop will follow hardware semantics even if one or more race conditions occur in state elements and/or one or more glitches occur in the clock tree.

Figure 6A:
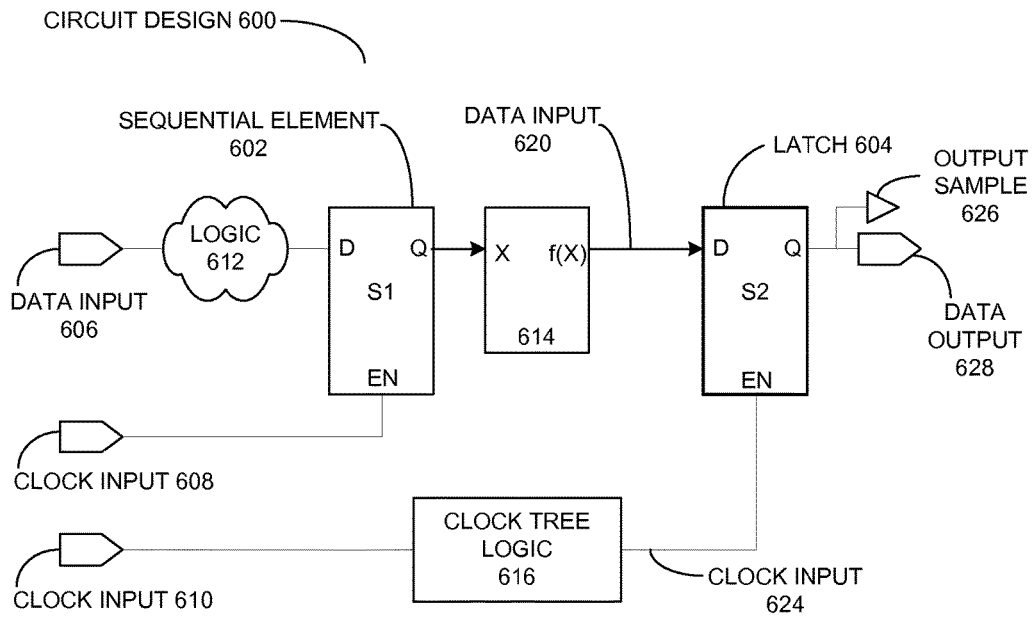
FIG. 6A illustrates an exemplary circuit design with a latch in accordance with an embodiment of the present invention.

FIG. 6A illustrates an exemplary circuit design with a latch in accordance with an embodiment of the present invention. In some embodiments, circuit design 600 can include sequential element 602, latch 604, combinational logic 612-614, and clock tree logic 616. During operation, data input 606 propagates to a data input of sequential element 602 (i.e., signal S1.D) via combinational logic 612. Sequential element 602 propagates the value of signal S1.D to signal S1.Q when clock input 608 satisfies a triggering condition.

Signal S1.Q propagates to a data input signal of latch 604 (i.e., signal S2.D) via combinational logic 614, which performs a logic transformation, such that it produces an output value f(X) for an input signal X. Latch 604 then propagates the value of signal S2.D to signal S2.Q if clock input 624 is at a triggering level. Note that clock tree logic 616 generates clock input 624 based at least on clock input 610.

Figure 6B:
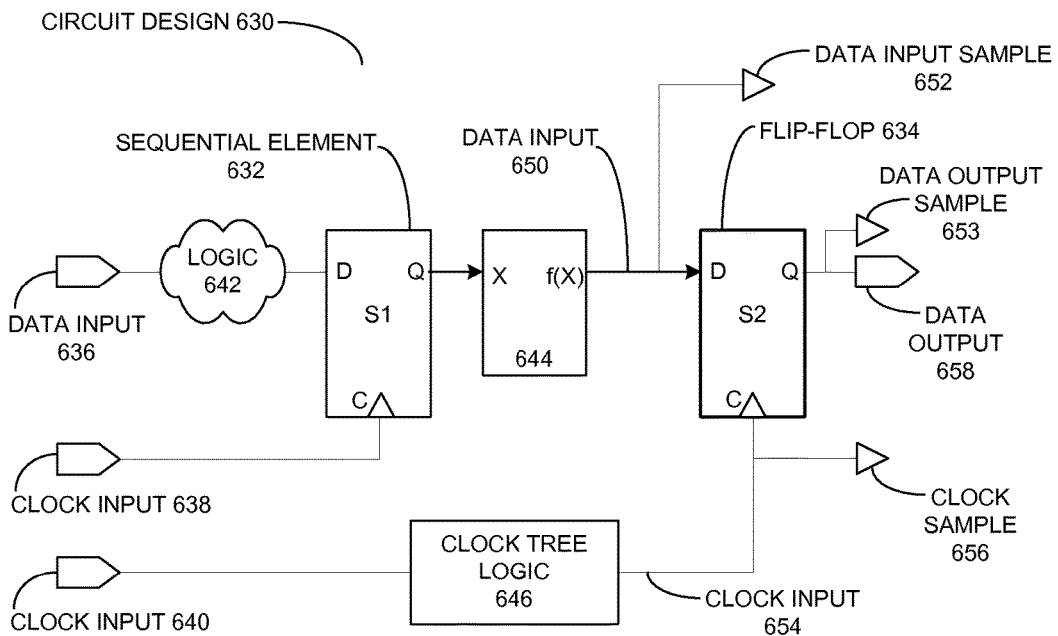
FIG. 6B illustrates an exemplary circuit design with a flip-flop in accordance with an embodiment of the present invention.

FIG. 6B illustrates an exemplary circuit design with a flip-flop in accordance with an embodiment of the present invention. In some embodiments, circuit design 630 can include sequential element 632, flip-flop 634, combinational logic 642 and 644, and clock tree logic 646. During operation, a data input 636 propagates to a data input of sequential element 632 (i.e., signal S1.D) via combinational logic 642. Sequential element 632 propagates the value of signal S1.D to signal S1.Q when a clock input 638 satisfies a triggering condition.

Also, signal S1.Q propagates to a data input signal of flip-flop 634 (i.e., signal S2.D) via combinational logic 644, which performs a logic transformation, such that it produces an output value f(X) for an input signal X. Flip-flop 634 then propagates the value of signal S2.D to signal S2.Q when clock input 654 experiences a triggering transition. Clock tree logic 646 generates clock input 654 based on clock input 640.

During simulation, the clock inputs to one or more sequential elements may experience a glitch which may cause the sequential elements to change their output values when they should not have changed the value. Alternatively, a race condition may exist that may cause a zero-delay simulator to assign a value to a sequential element's output which is different from what the value would have been if a physical circuit with non-zero delays had been simulated. In either case, the simulation would not follow hardware semantics.

Figure 7A:
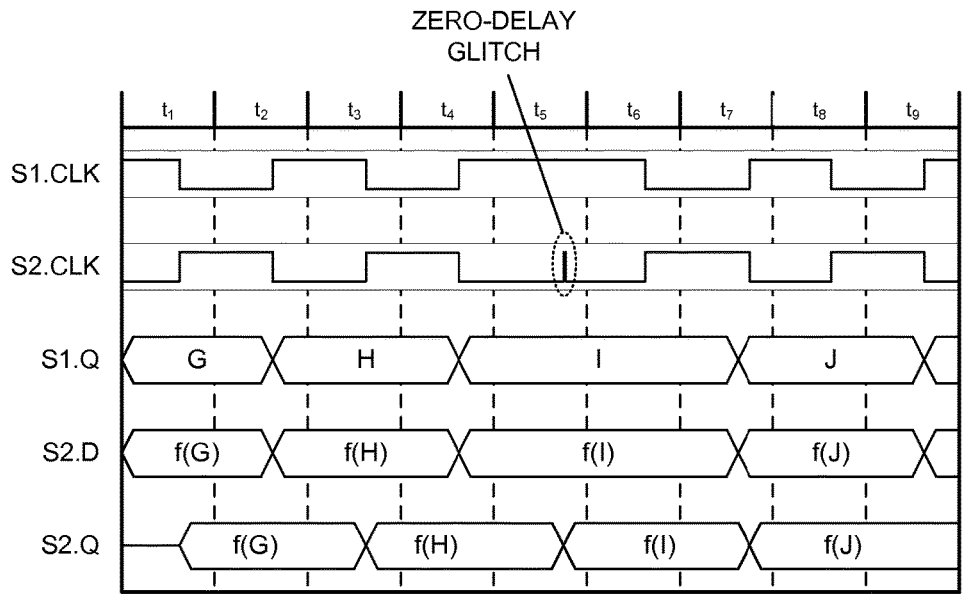
FIG. 7A illustrates an exemplary simulation output from a conventional logic simulation of a latch.

FIG. 7A illustrates an exemplary simulation output from a conventional logic simulation of a latch. FIG. 7A may illustrate a simulation output for circuit 600 of FIG. 6A. Note that the simulation output covers nine simulation iterations (i.e., simulation iterations $t_1$ through $t_9$).

The clock input for latch S2 is an inverse to the clock input for latch S1. This clock configuration is intended to prevent a data input of the circuit (i.e., signal S1.D) from propagating to a data output of the circuit (i.e., signal S2.Q) within a single clock period. More specifically, signal S1.Q obtains a value from S1.D when S1.CLK has a triggering value (e.g., a logic one value), which then propagates to signal S2.D. Then, when signal S2.CLK obtains a triggering value (and signal S1.CLK obtains a non-triggering value), signal S2.Q obtains a value from S2.D.

Unfortunately, a simulator may erroneously introduce a glitch in clock signal S2.CLK when clock signal S1.CLK has a triggering value (e.g., signal S2.CLK toggles during simulation iteration $t_5$). In a zero-delay simulation, the glitch can open a propagation path through latches S1 and S2 (i.e., a propagation path from signal S1.D to signal S2.Q). This glitch can cause signal S2.Q to obtain the value f(I) during simulation iteration $t_5$. The value f(I) was not intended to arrive at signal S2.Q until simulation iteration $t_6$ when clock signal S1.Q obtains a non-triggering value. In other words, in conventional simulators, signal S2.Q will not follow hardware semantics if signal S2.CLK experiences an unintended glitch.

Further, clock signal S2.CLK may be involved in a race condition, such that signal S2.CLK obtains a non-triggering value after signal S1.CLK obtains a triggering value (e.g., simulation iteration $t_7$). In a conventional zero-delay simulation, the race condition can open a propagation path through latches S1 and S2, because latch S2 remains in a transparent mode of operation when latch S1 enters the transparent mode of operation. This race condition causes signal S2.Q to obtain the value f(J) during simulation iteration $t_7$, which should not have occurred until simulation iteration $t_8$. In other words, in conventional simulators, signal S2.Q will not follow hardware semantics if clock signal S2.CLK is involved in a race condition.

Figure 7B:
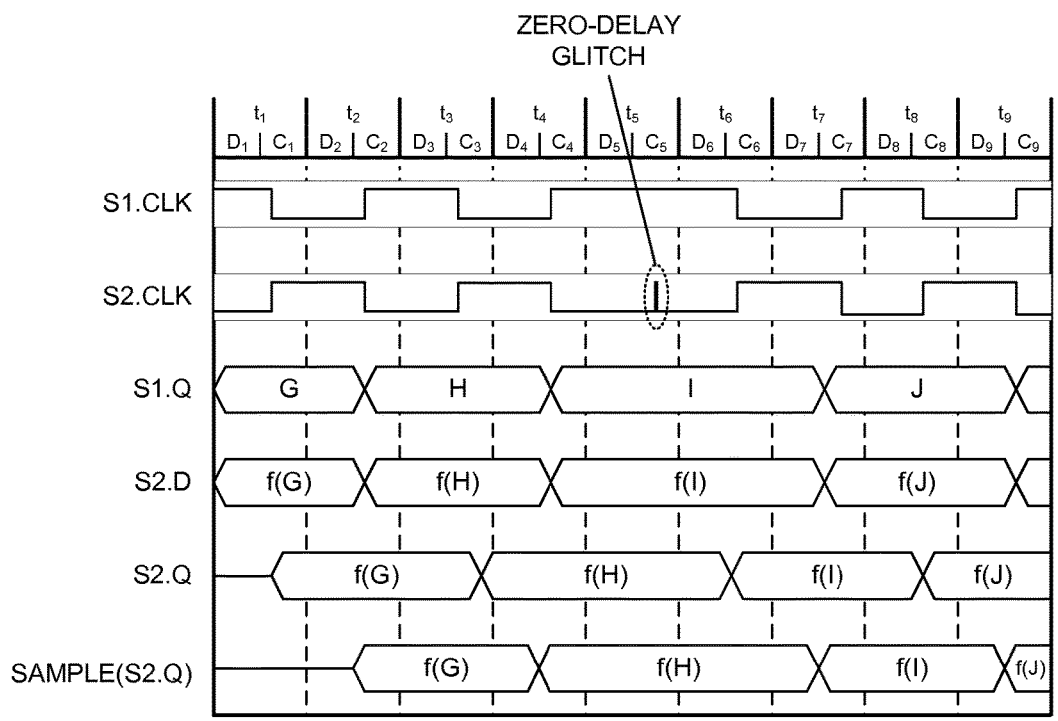
FIG. 7B illustrates an exemplary simulation output for a latch which is simulated using the new semantics which use sampled values in accordance with an embodiment of the present invention.

FIG. 7B illustrates an exemplary simulation output for a latch which is simulated using the new semantics which use sampled values in accordance with an embodiment of the present invention. FIG. 7B may illustrate a simulation output for circuit 600 of FIG. 6A. Latches S1 and S2 can be simulated using the new semantics as described in Tables 1A and 1B. Note that the simulation output covers nine simulation iterations (i.e., simulation iterations $t_1$ through $t_9$). Furthermore, a simulation iteration includes a stimuli application stage (illustrated by index $D_i$ for simulation iteration $t_i$), and includes a clock propagation stage (illustrated by index $C_i$ for simulation iteration $t_i$).

As before, the clock input for latch S2 is an inverse to the clock input for latch S1. This clock configuration causes signal S1.Q to obtain a value from S1.D when S1.CLK has a triggering value (e.g., a logic one value) and S2.CLK has a non-triggering value. Then, when signal S2.CLK obtains a triggering value (and S1.CLK obtains a non-triggering value), signal S2.Q obtains a value from S2.D. In some embodiments, SAMPLE(S2.Q) obtains a value from signal S2.Q after a stimuli application stage and before a subsequent clock propagation stage (i.e., after $D_i$ and before $C_i$, for a simulation iteration $t_i$).

When a simulator erroneously introduces a glitch in clock signal S2.CLK when clock signal S1.CLK has a triggering value (e.g., signal S2.CLK toggles during simulation iteration $t_5$), the glitch can open a propagation path through latches S1 and S2 (i.e., a propagation path from signal S1.D to signal S2.Q), which can cause latch S2 to assign the value f(I) to its data output during simulation iteration $t_5$. However, unlike a conventional zero-delay logic simulation, some embodiments of the present invention use the new semantics to recover from this situation because signal S2.Q obtains the value f(H) from SAMPLE(S2.Q) when signal S2.CLK obtains the non-triggering value during clock propagation stage $C_5$, which causes signal S2.Q to retain the value it had before the glitch. In other words, by using the sampled value, some embodiments of the present invention can ensure that the simulation follows hardware semantics even if the simulator introduces an unintended glitch in a signal.

Further, as explained above, clock signal S2.CLK can be involved in a race condition, such that clock signal S2.CLK obtains a non-triggering value after signal S1.CLK obtains a triggering value (e.g., during the clock propagation stage $C_7$ of simulation iteration $t_7$). The race condition can open a propagation path through latches S1 and S2, which can cause the simulator to assign the value f(J) to its data output during simulation iteration $t_7$. However, unlike a conventional zero-delay logic simulation, some embodiments of the present invention use the new semantics to recover from this situation because signal S2.Q obtains the value f(I) from SAMPLE(S2.Q) when signal S2.CLK obtains the non-triggering value during clock propagation stage $C_7$, which causes signal S2.Q to retain the value it had before the race condition.

Figure 8A:
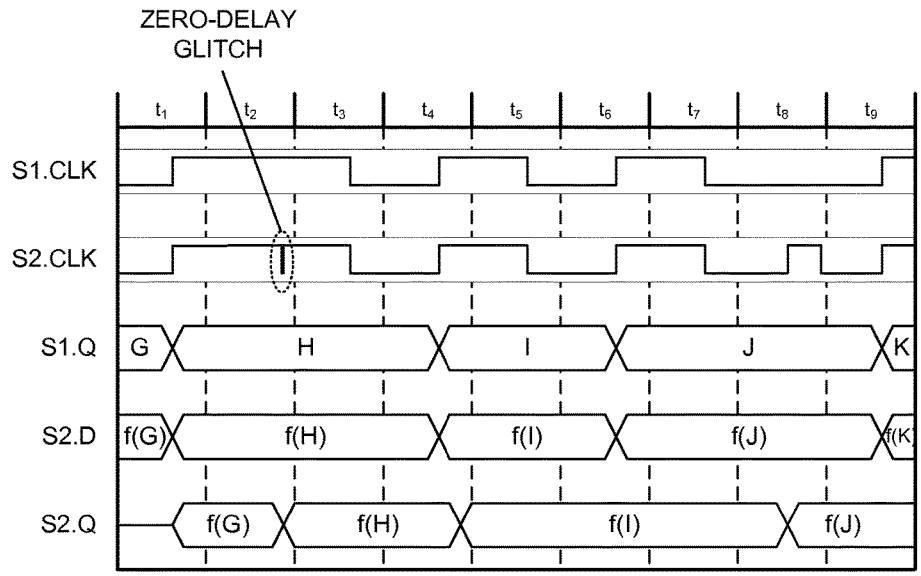
FIG. 8A illustrates an exemplary simulation output from a convention logic simulation of a flip-flop.

FIG. 8A illustrates an exemplary simulation output from a convention logic simulation of a flip-flop. FIG. 8A can illustrates a simulation output for circuit 630 of FIG. 6B. Note that the simulation output covers nine simulation iterations (i.e., simulation iterations $t_1$ through $t_9$).

The clock input for flip-flop S2 may be substantially similar to the clock input for flip-flop S1. Signal S1.Q obtains a value from S1.D when S1.CLK experiences a triggering edge-transition (e.g., a transition from a logic zero to a logic one). Simultaneously, signal S2.Q obtains a value from S2.D when S2.CLK obtains a triggering edge-transition.

A simulator may introduce an unintentional glitch in clock signal S2.CLK which can cause S2.CLK to temporarily hold a logic zero (e.g., the glitch on signal S2.CLK during simulation iteration $t_2$). In a conventional zero-delay simulation, the glitch can cause signal S2.Q to obtain the value from signal S2.D when signal S2.CLK obtains a triggering edge-transition. This glitch causes signal S2.Q to obtain the value f(H) during simulation iteration $t_2$, which should not have arrived at signal S2.Q until simulation iteration $t_4$ when clock signal S1.Q obtains a triggering edge-transition. Further, as shown in FIG. 8A, clock signal S2.CLK can experience another glitch which causes S2.CLK to temporarily hold a logic one (e.g., the glitch on signal S2.CLK during simulation iteration $t_8$). The glitch can cause signal S2.Q to obtain the value from signal S2.D when signal S2.CLK obtains a triggering edge-transition. This glitch causes signal S2.Q to obtain the value f(J) during simulation iteration $t_8$, which should not have arrived at signal S2.Q until simulation iteration $t_9$ when clock signal S1.Q obtains a triggering edge-transition. In other words, conventional zero-delay simulators may not follow hardware semantics when a clock signal experiences an unintentional glitch.

Further, clock signal S2.CLK can be involved in a race condition, such that signal S2.CLK obtains a triggering edge-transition after signal S1.CLK obtains a triggering edge-transition (e.g., simulation iteration $t_4$). In a conventional zero-delay simulation, the race condition can cause a signal to propagate across flip-flops S1 and S2 within a single clock cycle. More specifically, a signal can propagate to S1.Q at the start of the race condition when signal S1.CLK obtains a triggering edge-transition. Then, the signal can propagate to S2.Q at the end of the race condition when signal S2.CLK obtains the triggering edge-transition. This race condition causes signal S2.Q to obtain the value f(I) during simulation iteration $t_4$, which should not have occurred until simulation iteration $t_6$.

Figure 8B:
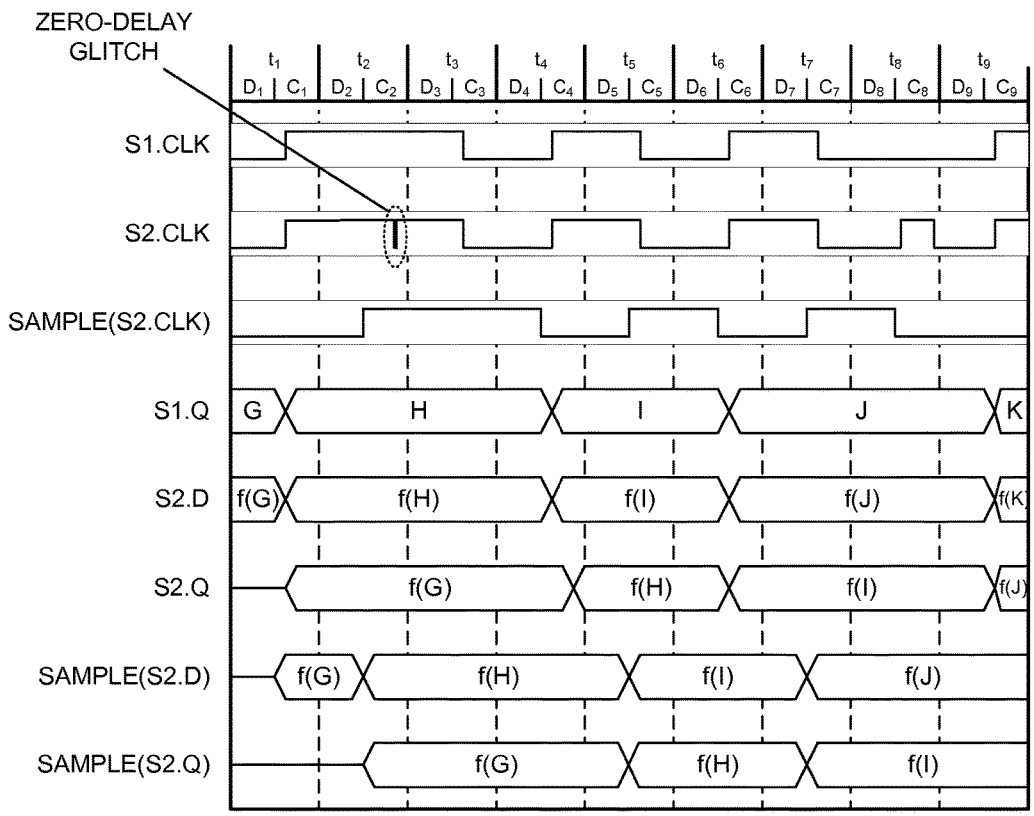
FIG. 8B illustrates an exemplary simulation output for a flip-flop which is simulated using the new semantics in accordance with an embodiment of the present invention.

FIG. 8B illustrates an exemplary simulation output for a flip-flop which is simulated using the new semantics in accordance with an embodiment of the present invention. FIG. 8B may illustrate a simulation output for circuit 630 of FIG. 6B. Furthermore, flip-flops S1 and S2 may be simulated using the semantics shown in Table 2. Note that the simulation output covers nine simulation iterations (i.e., simulation iterations $t_1$ through $t_9$). Furthermore, a simulation iteration includes a stimuli application stage (illustrated by index $D_i$ for simulation iteration $t_i$), and includes a clock propagation stage (illustrated by index $C_i$ for simulation iteration $t_i$).

As before, the clock input for flip-flop S2 can be substantially similar to the clock input for flip-flop S1. Signal S1.Q obtains a value from S1.D when S1.CLK obtains a triggering edge-transition (e.g., a transition from a logic zero to a logic one). Simultaneously, signal S2.Q obtains a value from S2.D when S2.CLK obtains a triggering edge-transition. Some embodiments of the present invention sample the value of S2.CLK to obtain SAMPLE(S2.CLK) towards the end of the stimuli application stage, but before a subsequent clock propagation stage begins (i.e., after $D_i$ and before $C_i$, for a simulation iteration $t_i$). Similarly, SAMPLE(S2.D) obtains a value from signal S2.D, and SAMPLE(S2.Q) obtains a value from signal S2.Q, towards the end of a stimuli application stage, but before a subsequent clock propagation stage.

When clock signal S2.CLK experiences a glitch, it causes S2.CLK to temporarily hold a logic zero (e.g., the glitch on signal S2.CLK during simulation iteration $t_2$). The glitch can cause the flip-flop to assign a new value to its data output when its clock obtains a triggering edge-transition. However, unlike a conventional zero-delay simulation, some embodiments of the present invention recover from this situation because SAMPLE(S2.CLK) does not hold a logic zero value when signal S2.CLK obtains a triggering edge-transition.

Further, when clock signal S2.CLK experiences a glitch which causes S2.CLK to temporarily hold a logic one (e.g., the glitch on signal S2.CLK during simulation iteration $t_8$), it can cause a conventional simulator to assign a new value to its data output when its clock obtains a triggering edge-transition. However, unlike a conventional zero-delay logic simulation, some embodiments of the present invention recover from this situation by causing signal S2.Q to obtain the value f(I) from SAMPLE(S2.Q), when signal S2.CLK obtains the non-triggering edge-transition during clock propagation stage $C_8$. In this manner, some embodiments of the present invention cause signal S2.Q to retain the value it had before the glitch, and in doing so, ensure that the simulation follows hardware semantics.

Suppose clock signal S2.CLK is involved in a race condition, in which signal S2.CLK obtains a triggering edge-transition after signal S1.CLK obtains a triggering edge-transition (e.g., simulation iteration $t_4$). In conventional simulators, the race condition can cause a signal to propagate across the two flip-flops within a single clock cycle. However, unlike conventional zero-delay simulators, some embodiments of the present invention assign SAMPLE(S2.D) to signal S2.Q when signal S2.CLK obtains a triggering edge-transition, thereby ensuring that the race condition between does not cause a new value from S1.Q to propagate through flip-flop S2. In other words, some embodiments of the present invention ensure that the simulation follows hardware semantics even if race conditions exist in the circuit.

Figure 9:
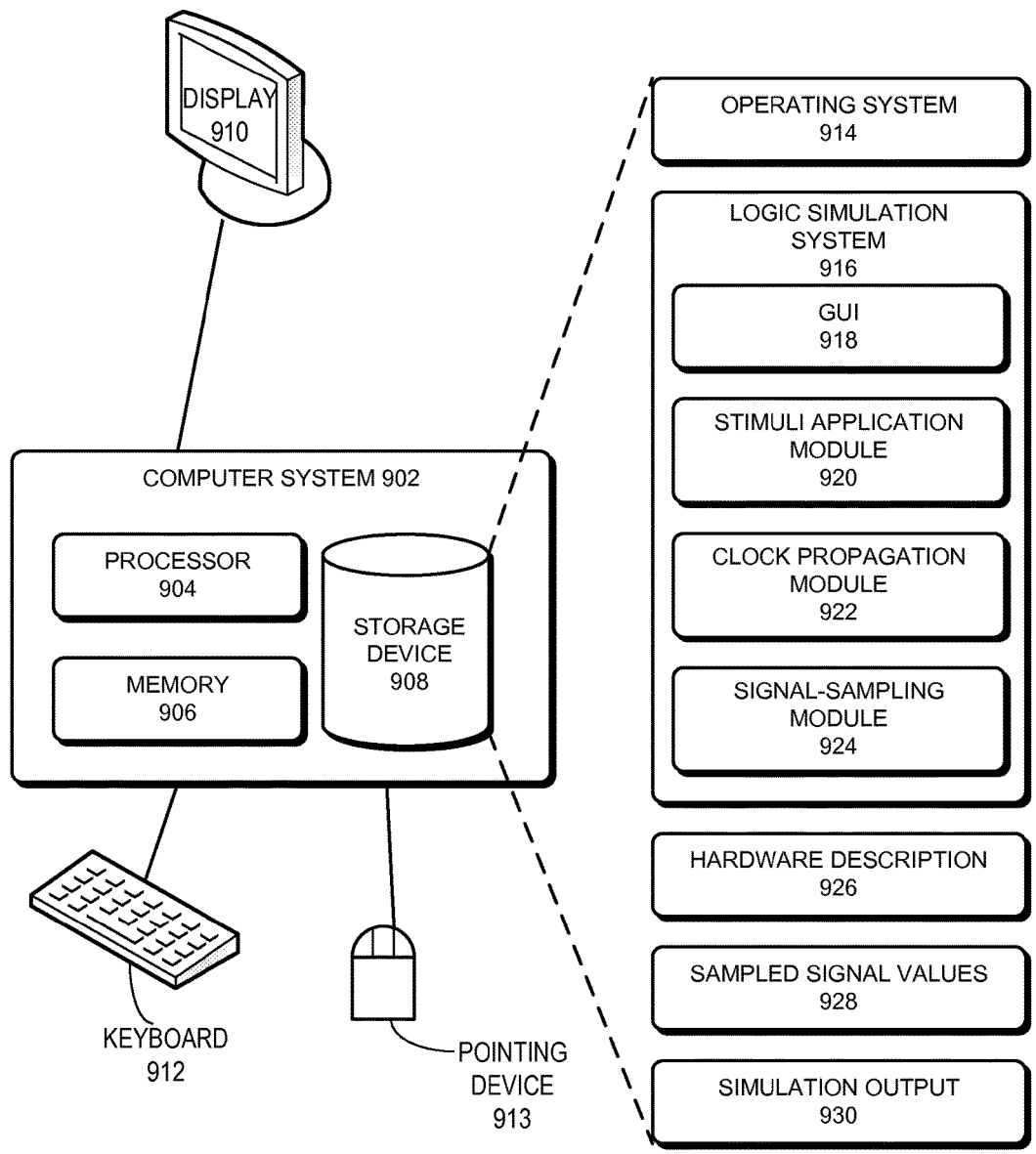
FIG. 9 illustrates an exemplary computer system that facilitates simulating a circuit design according to hardware semantics in accordance with an embodiment of the present invention.

FIG. 9 illustrates an exemplary computer system that facilitates simulating a circuit design according to hardware semantics in accordance with an embodiment of the present invention. Computer system 902 includes a processor 904, a memory 906, and a storage device 908. Furthermore, computer system 902 can be coupled to a display device 910, a keyboard 912, and a pointing device 913.

Storage device 908 stores an operating system 914, a logic simulation system 916, a hardware description 926, a set of sampled signal values 928, and a simulation output 930. Logic simulation system 916 can include a graphical user interface (GUI) 918, a stimuli application module 920, a clock propagation module 922, and a signal-sampling module 924.

During operation, logic simulation system 916 is loaded from storage device 908 into memory 906 and is executed by processor 904. In some embodiments, logic simulation system 916 can take as input a hardware description 926 for a circuit design, and generates a simulation output 930 for hardware description 926, such that simulation output 930 is in accordance with hardware semantics.

In some embodiments, stimuli application module 920 performs a stimuli application stage for a simulation of hardware description 926. During operation, stimuli application module 920 evaluates a signal of hardware description 926 which does not depend on a clock input signal. Clock propagation module 922 performs a clock propagation stage for the simulation of hardware description 926. During operation, clock propagation module 922 evaluates a signal of hardware description 926 which depends on a clock input signal. If clock propagation module 922 needs a sampled value to evaluate the signal, clock propagation module 922 can provide the signal to signal-sampling module 924, and signal-sampling module 924 will return a sampled signal value 928 for the signal.

In some embodiments, signal-sampling module 924 can sample a value for a signal of hardware description 926 at the end of the stimuli application stage (i.e., after the stimuli application stage completes, and before a subsequent clock propagation stage begins). To do so, signal-sampling module 924 reads a simulation value for a signal in hardware description 926, and stores the sampled signal value 928 for the signal until it is sampled again after a subsequent stimuli application stage. Furthermore, signal-sampling module 924 can provide sampled signal value 928 to stimuli application module 920 and to clock propagation module 922 during simulation of hardware description 926.

Figure 10:
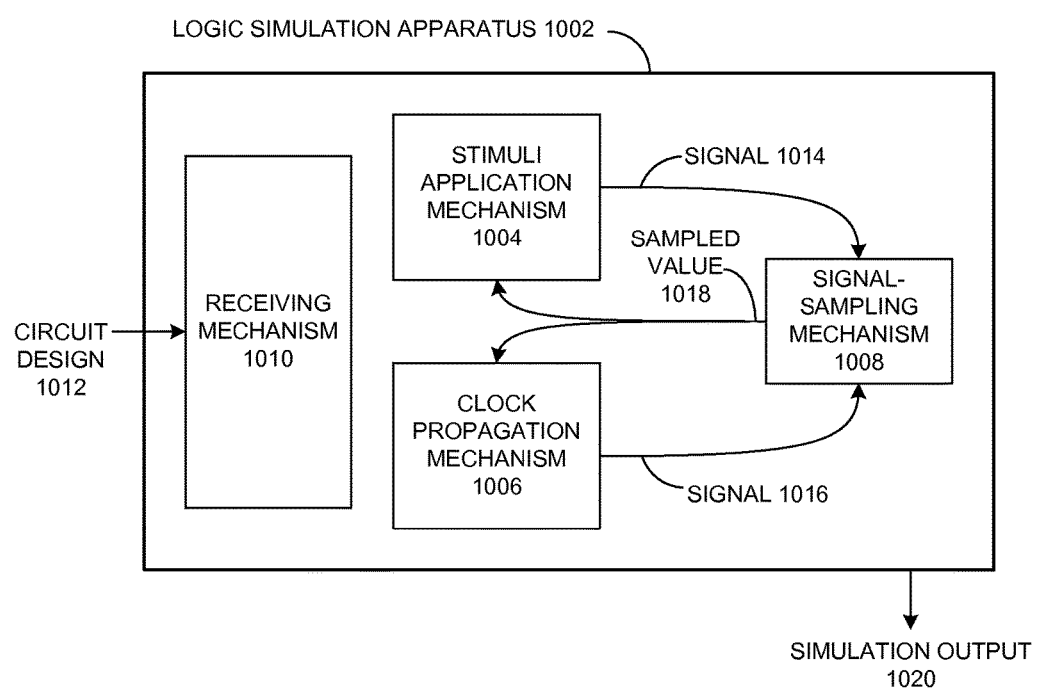
FIG. 10 illustrates an apparatus that facilitates performing a logic simulation of a circuit design in accordance with an embodiment of the present invention.

FIG. 10 illustrates an apparatus that facilitates performing a logic simulation of a circuit design in accordance with an embodiment of the present invention. Apparatus 1002 can comprise a number of mechanisms which may communicate with one another via a wired or wireless communication channel. Apparatus 1002 may be realized using one or more integrated circuits, and it may be integrated in a computer system, or it may be realized as a separate device which is capable of communicating with other computer systems and/or devices. Specifically, logic simulation apparatus 1002 can include a stimuli application mechanism 1004, a clock propagation mechanism 1006, a signal-sampling mechanism 1008, and a receiving mechanism 1010.

In some embodiments, logic simulation apparatus 1002 takes as input a circuit design 1012, and generates a simulation output 1020 for a circuit design 1012, such that simulation output 1020 is in accordance with hardware semantics.

In some embodiments, stimuli application mechanism 1004 performs a stimuli application stage for a simulation of circuit design 1012. During operation, stimuli application mechanism 1004 evaluates a signal of circuit design 1012 which does not depend on a clock input signal. If stimuli application mechanism 1004 needs a sampled value to evaluate the signal, stimuli application mechanism 1004 can provide signal 1014 to signal-sampling mechanism 1008, and signal-sampling mechanism 1008 will return a sampled value 1018 for signal 1014. Similarly, clock propagation mechanism 1006 performs a clock propagation stage for the simulation of circuit design 1012. During operation, clock propagation mechanism 1006 evaluates a signal of circuit design 1012 which depends on a clock input signal. If clock propagation mechanism 1006 needs a sampled value to evaluate the signal, clock propagation mechanism 1006 can provide signal 1016 to signal-sampling mechanism 1008, and signal-sampling mechanism 1008 will return a sampled value 1018 for signal 1016.

In some embodiments, signal-sampling mechanism 1008 can sample a value for a signal of circuit design 1012 at the end of the stimuli application stage (i.e., after the stimuli application stage completes, and before a subsequent clock propagation stage begins). To do so, signal-sampling mechanism 1008 reads a simulation value for a signal in circuit design 1012, and stores the sampled value for the signal until the signal is sampled again after a subsequent stimuli application stage. Furthermore, signal-sampling mechanism 1008 can provide stimuli application mechanism 1004 and clock propagation mechanism 1006 with a sampled value (e.g., sampled value 1018) for a signal of circuit design 1012 (e.g., signals 1014-1016).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method to simulate an integrated circuit (IC) design during verification of the IC design, wherein a simulation cycle includes a stimuli application stage and a clock propagation stage, wherein signal values that do not depend on a clock are evaluated during the stimuli application stage, and wherein signal values that depend on a clock are evaluated during the clock propagation stage, the method comprising:
   receiving a description of the IC design, wherein the IC design includes a level-sensitive sequential circuit element which includes at least a data input and at least a data output, and wherein the level-sensitive sequential circuit element propagates the data input's value to the data output when at least one condition in a group of conditions is true; and
   simulating, by using a computer, the level-sensitive sequential circuit element during the simulation cycle by at least:
      during the stimuli application stage, (1) applying and propagating stimuli through combinational logic to determine a value at the data input of the level-sensitive sequential circuit element, and (2) sampling the data output's value to obtain a sampled output value; and
      during the clock propagation stage,
         assigning the data input's value to the data output when a glitch causes at least one condition in a group of conditions to be momentarily true during the clock propagation stage, and
         assigning the sampled output value to the data output in response to determining that all conditions in the group of conditions are false after the glitch.

2. The method of claim 1, further comprising analyzing the description of the IC design to identify clocks and the level-sensitive sequential circuit element.

3. The method of claim 1, wherein the description of the IC design is written in a hardware description language which supports a sampling instruction which when executed causes a parameter of the sampling instruction to be sampled during the stimuli application stage.

4. The method of claim 3, further comprising rewriting the description of the IC design so that the rewritten description of the IC design uses the sampling instruction to sample the data output's value.

5. The method of claim 1, wherein a signal in the IC design is represented using four valued logic.

6. A non-transitory computer-readable storage medium storing instructions that when executed by a computer cause the computer to perform a method to simulate an integrated circuit (IC) design during verification of the IC design, wherein a simulation cycle includes a stimuli application stage and a clock propagation stage, wherein signal values that do not depend on a clock are evaluated during the stimuli application stage, and wherein signal values that depend on a clock are evaluated during the clock propagation stage, the method comprising:
   receiving a description of the IC design, wherein the IC design includes a level-sensitive sequential circuit element which includes at least a data input and at least a data output, and wherein the level-sensitive sequential circuit element propagates the data input's value to the data output when at least one condition in a group of conditions is true; and
   simulating the level-sensitive sequential circuit element during the simulation cycle by at least:
      during the stimuli application stage, (1) applying and propagating stimuli through combinational logic to determine a value at the data input of the level-sensitive sequential circuit element, and (2) sampling the data output's value to obtain a sampled output value; and
      during the clock propagation stage,
         assigning the data input's value to the data output when a glitch causes at least one condition in a group of conditions to be momentarily true during the clock propagation stage, and
         assigning the sampled output value to the data output in response to determining that all conditions in the group of conditions are false after the glitch.

7. The non-transitory computer-readable storage medium of claim 6, further comprising analyzing the description of the IC design to identify primary clocks and the level-sensitive sequential circuit element.

8. The non-transitory computer-readable storage medium of claim 6, wherein the description of the IC design is written in a hardware description language which supports a sampling instruction which when executed causes a parameter of the sampling instruction to be sampled during the stimuli application stage.

9. The non-transitory computer-readable storage medium of claim 8, further comprising rewriting the description of the IC design so that the rewritten description of the IC design includes sampling instructions for sampling the data output's value.

10. The non-transitory computer-readable storage medium of claim 6, wherein a signal in the IC design is represented using four valued logic.

11. An apparatus, comprising hardware modules, that simulates an integrated circuit (IC) design during verification of the IC design, wherein a simulation cycle includes a stimuli application stage and a clock propagation stage, wherein signal values that do not depend on a clock are evaluated during the stimuli application stage, and wherein signal values that depend on a clock are evaluated during the clock propagation stage, the apparatus configured to:
   receive a description of the IC design, wherein the IC design includes a level-sensitive sequential circuit element which includes at least a data input and at least a data output, and wherein the level-sensitive sequential circuit element propagates the data input's value to the data output when at least one condition in a group of conditions is true;
   perform the stimuli application stage of the simulation cycle, wherein performing the stimuli application stage comprises applying and propagating stimuli through combinational logic to determine a value at the data input of the level-sensitive sequential circuit element;
   sample the data output's value during the stimuli application stage to obtain a sampled output value; and
   perform the clock propagation stage of the simulation cycle, wherein performing the clock propagation stage comprises:
      assigning the data input's value to the data output when a glitch causes at least one condition in a group of conditions to be momentarily true during the clock propagation stage, and assigning the sampled output value to the data output in response to determining that all conditions in the group of conditions are false after the glitch.

12. A method to simulate an integrated circuit (IC) design during verification of the IC design, wherein a simulation cycle includes a stimuli application stage and a clock propagation stage, wherein signal values that do not depend on a clock are evaluated during the stimuli application stage, and wherein signal values that depend on a clock are evaluated during the clock propagation stage, the method comprising:

receiving a description of the IC design, wherein the IC design includes an edge-triggered sequential circuit element which includes at least a data input, at least a data output, and at least a clock input, wherein the edge-triggered sequential circuit element propagates the data input's value to the data output based at least on detecting a triggering edge-transition of the clock input from a first value to a second value; and simulating, by using a computer, the edge-triggered sequential circuit element during the simulation cycle by at least:

during the stimuli application stage, (1) applying and propagating stimuli through combinational logic to determine a value at the data input of the edge-triggered sequential circuit element, (2) sampling the data input's value to obtain a sampled input value, (3) sampling the data output's value to obtain a sampled output value, and (4) sampling the clock input's value to obtain a sampled clock value; and during the clock propagation stage, (1) assigning the sampled input value to the data output in response to detecting that the clock input experienced a triggering edge-transition from the first value to the second value, and that the sampled clock value is equal to the first value, (2) not assigning the sampled input value to the data output in response to detecting that the clock input experienced the triggering edge-transition from the first value to the second value, and that the sampled clock value is not equal to the first value, and (3) assigning the sampled output value to the data output in response to detecting a non-triggering edge transition in the clock input from the second value to the first value.

13. The method of claim 12, further comprising analyzing the description of the IC design to identify the edge-triggered sequential circuit element.

14. The method of claim 12, wherein the description of the IC design is written in a hardware description language which supports a sampling instruction which when executed causes a parameter of the sampling instruction to be sampled during the stimuli application stage.

15. The method of claim 14, further comprising rewriting the description of the IC design so that the rewritten description of the IC design uses the sampling instruction to sample the data output's value.

16. The method of claim 12, wherein a signal in the IC design is represented using four valued logic.

17. A non-transitory computer-readable storage medium storing instructions that when executed by a computer cause the computer to perform a method to simulate an integrated circuit (IC) design during verification of the IC design, wherein a simulation cycle includes a stimuli application stage and a clock propagation stage, wherein signal values that do not depend on a clock are evaluated during the stimuli application stage, and wherein signal values that depend on a clock are evaluated during the clock propagation stage, the method comprising:

receiving a description of the IC design, wherein the IC design includes an edge-triggered sequential circuit element which includes at least a data input, at least a data output, and at least a clock input, wherein the edge-triggered sequential circuit element propagates the data input's value to the data output based at least on detecting a triggering edge-transition of the clock input from a first value to a second value; and simulating the edge-triggered sequential circuit element during the simulation cycle by at least:

during the stimuli application stage, (1) applying and propagating stimuli through combinational logic to determine a value at the data input of the edge-triggered sequential circuit element, (2) sampling the data input's value to obtain a sampled input value, (3) sampling the data output's value to obtain a sampled output value, and (4) sampling the clock input's value to obtain a sampled clock value; and during the clock propagation stage, (1) assigning the sampled input value to the data output in response to detecting that the clock input experienced a triggering edge-transition from the first value to the second value, and that the sampled clock value is equal to the first value, (2) not assigning the sampled input value to the data output in response to detecting that the clock input experienced the triggering edge-transition from the first value to the second value, and that the sampled clock value is not equal to the first value, and (3) assigning the sampled output value to the data output in response to detecting a non-triggering edge transition in the clock input from the second value to the first value.

18. The non-transitory computer-readable storage medium of claim 17, further comprising analyzing the description of the IC design to identify the sequential edge-triggered circuit element.

19. The non-transitory computer-readable storage medium of claim 17, wherein the description of the IC design is written in a hardware description language which supports a sampling instruction which when executed causes a parameter of the sampling instruction to be sampled during the stimuli application stage.

20. The non-transitory computer-readable storage medium of claim 19, further comprising rewriting the description of the IC design so that the rewritten description of the IC design uses the sampling instruction to sample the data output's value.

21. The non-transitory computer-readable storage medium of claim 17, wherein a signal in the IC design is represented using four valued logic.

22. An apparatus, comprising hardware modules, that simulates an integrated circuit (IC) design during verification of the IC design, wherein a simulation cycle includes a stimuli application stage and a clock propagation stage, wherein signal values that do not depend on a clock are evaluated during the stimuli application stage, and wherein signal values that depend on a clock are evaluated during the clock propagation stage, the apparatus configured to:

receive a description of the IC design, wherein the IC design includes an edge-triggered sequential circuit element which includes a data input, a data output, and a clock input, wherein the edge-triggered sequential circuit element propagates the data input's value to the data output based at least on detecting a triggering edge-transition of the clock input from a first value to a second value;

perform the stimuli application stage of the simulation cycle, wherein the stimuli application stage comprises applying and propagating stimuli through combinational logic to determine a value at the data input of the edge-triggered sequential circuit element;

sample (1) the data input's value during the stimuli application stage to obtain a sampled input value, (2) the data output's value during the stimuli application stage to obtain a sampled output value, and (3) the clock input's value during the stimuli application stage to obtain a sampled clock value; and perform the clock propagation stage of the simulation cycle, wherein performing the clock propagation stage comprises (1) assigning the sampled input value to the data output in response to detecting that the clock input experienced a triggering edge-transition from the first value to the second value, and that the sampled clock value is equal to the first value, (2) not assigning the sampled input value to the data output in response to detecting that the clock input experienced the triggering edge-transition from the first value to the second value, and that the sampled clock value is not equal to the first value, and (3) assigning the sampled output value to the data output in response to detecting a non-triggering edge transition in the clock input from the second value to the first value.

\* \* \* \* \*